United States Patent
Kim

(10) Patent No.: US 10,411,724 B2
(45) Date of Patent: Sep. 10, 2019

(54) TWO-STEP SINGLE-SLOPE COMPARATOR WITH HIGH LINEARITY AND CMOS IMAGE SENSOR INCLUDING THE SAME

(71) Applicant: SK hynix Inc., Gyeonggi-do (KR)

(72) Inventor: Hyeon-June Kim, Jeollanam-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/996,987

(22) Filed: Jun. 4, 2018

(65) Prior Publication Data
US 2019/0058483 A1 Feb. 21, 2019

(30) Foreign Application Priority Data
Aug. 21, 2017 (KR) .......................... 10-2017-0105323

(51) Int. Cl.
| | |
|---|---|
| *H04N 5/3745* | (2011.01) |
| *H04N 5/378* | (2011.01) |
| *H03M 1/14* | (2006.01) |
| *H03M 1/56* | (2006.01) |
| *H03M 1/06* | (2006.01) |

(52) U.S. Cl.
CPC .............. *H03M 1/14* (2013.01); *H03M 1/56* (2013.01); *H04N 5/378* (2013.01); *H04N 5/37455* (2013.01); *H03M 1/0607* (2013.01); *H03M 2201/23* (2013.01)

(58) Field of Classification Search
CPC ............... H04N 5/37455; H04N 5/378; H04N 5/23229; H04N 5/374; H04N 5/3745; H03M 1/12; H03M 1/14; H03M 1/144; H03M 1/145; H03M 1/16; H03M 1/162; H03M 1/164; H03M 1/165; H03M 1/34; H03M 1/345; H03M 1/56; H03M 1/50; H03M 1/0607; H03M 1/1245; H03M 2201/23
USPC ......................................... 348/281, 302, 308
See application file for complete search history.

(56) References Cited

U.S. PATENT DOCUMENTS

| | | | | |
|---|---|---|---|---|
| 6,670,904 | B1 | 12/2003 | Yakovlev | |
| 2009/0273500 | A1* | 11/2009 | Krymski | ............... H03M 1/144 341/155 |
| 2009/0316034 | A1* | 12/2009 | Kusuda | .................. H04N 5/374 348/308 |

(Continued)

FOREIGN PATENT DOCUMENTS

| | | |
|---|---|---|
| KR | 101293057 | 8/2013 |
| KR | 101645571 | 8/2016 |

OTHER PUBLICATIONS

Lim, S. et al., A High-Speed CMOS Image Sensor With Column-Parallel Two-Step Single-Slope ADCs, IEEE Transactions on Electron Devices, vol. 56, No. 3, Mar. 2009.

*Primary Examiner* — Albert H Cutler
(74) *Attorney, Agent, or Firm* — IP & T Group LLP

(57) ABSTRACT

A comparator includes a first comparison block suitable for sampling a pixel signal, comparing a sampled pixel signal with a coarse ramping voltage, outputting a first comparison signal, sampling a coarse step voltage and outputting a residue voltage as a difference voltage between the sampled pixel signal and a sampled coarse step voltage; and a second comparison block suitable for comparing a fine ramping voltage with the residue voltage of the first comparison block and outputting a second comparison signal.

13 Claims, 9 Drawing Sheets

(56) References Cited

U.S. PATENT DOCUMENTS

| | | | | |
|---|---|---|---|---|
| 2010/0265114 A1* | 10/2010 | Lee | ............... | H03M 1/1225 |
| | | | | 341/155 |
| 2012/0038809 A1* | 2/2012 | Lee | ............... | H04N 5/3575 |
| | | | | 348/308 |
| 2012/0138775 A1* | 6/2012 | Cheon | ............... | H04N 5/361 |
| | | | | 250/208.1 |
| 2013/0077445 A1* | 3/2013 | Um | ............... | G10K 11/346 |
| | | | | 367/135 |
| 2013/0256511 A1* | 10/2013 | Kim | ............... | H01L 27/146 |
| | | | | 250/208.1 |
| 2014/0266309 A1* | 9/2014 | Jakobson | ............... | H04N 5/378 |
| | | | | 327/63 |
| 2015/0194973 A1* | 7/2015 | Furuta | ............... | H03M 1/002 |
| | | | | 348/308 |
| 2016/0248409 A1* | 8/2016 | Song | ............... | H03K 4/48 |
| 2017/0019621 A1* | 1/2017 | Totsuka | ............... | H01L 27/14609 |

* cited by examiner

TWO-STEP SINGLE-SLOPE COMPARATOR WITH HIGH LINEARITY AND CMOS IMAGE SENSOR INCLUDING THE SAME

CROSS-REFERENCE TO RELATED APPLICATION

The present application claims priority of Korean Patent Application No. 10-2017-0105323, filed on Aug. 21, 2017, which is incorporated herein by reference in its entirety.

BACKGROUND

1. Field

Various embodiments of the present invention generally relate to a complementary metal oxide semiconductor (CMOS) image sensor. Particularly, the embodiments relate to a two-step single-slope comparator and a CMOS image sensor including the same for preventing a linearity error caused by an operation structure.

2. Description of the Related Art

A CMOS image sensor has a trade-off relationship between speed and power. A CMOS image sensor with a column-parallel structure having an optimum speed/power trade-off relationship is widely used.

An analog-to-digital converter (ADC) included in the CMOS image sensor having the column-parallel structure is typically integrated within a shallow width of a pixel, in which case a single-slope ADC is widely used.

Recently, high resolution and high-speed operations of the CMOS image sensor are required to meet the needs of customers and to meet the requirements of the various and increasing number of applications for such sensors.

However, it is technically difficult to implement a high-speed operation of the CMOS image sensor due to the operation speed limitations in proportion to the increase of the resolution according to characteristics of a single-slope ADC.

Thus, a two-step analog-to-digital converting device has been developed to implement the high-speed operation instead of the single-slope ADC.

The two-step analog-to-digital converting device performs an analog-to-digital conversion operation by determining a most significant bit (MSB) value of a sampling value in a coarse step and a least significant bit (LSB) value of the sampling value in a fine step. Thus, a two-step analog-to-digital converting device may improve operation speed as compared with the single-step ADC.

Use of a two-step analog-to-digital converting device is shown in the following documents: Alexey Yakovlev, "DOUBLE-RAMP ADC FOR CMOS SENSORS"; U.S. Pat. No. 6,670,904 B1; and Seunghyun Lim, "A High-Speed CMOS Image Sensor With Column-Parallel Two-Step Single-Slope ADCs," IEEE Trans. Electron Devices, vol. 56, no. 3, pp. 393-398, March. 2009.

In these documents, a coarse ramping voltage for MSB conversion is stored on a top plate of a capacitor and then, a voltage of a floating state stored in the top plate of the capacitor is changed according to a fine ramping voltage when an input terminal for a fine ramping operation is coupled to a bottom plate of the capacitor during the fine ramping operation for a LSB conversion.

That is, in these documents, the coarse ramping voltage and the fine ramping voltage are alternating-current (AC) coupled in the top plate of the capacitor by sampling the coarse ramping voltage of a ramp signal generation device at the top plate of the capacitor and applying the fine ramping voltage to the bottom plate of the capacitor.

However, in these documents, when the fine ramping voltage is applied to the bottom plate, a gain error occurs due to a parasitic capacitor between a gate and a source of an input transistor of a comparator, and a linearity error occurs between the MSB value and the LSB value.

In another application, a 4-input comparator using four input transistors is used for the two-step single-slope analog-to-digital conversion.

However, in this other application, since a transfer conductance of each input transistor is changed according to a common voltage level, a linearity error is caused by a changed transfer conductance when the common voltage level is changed.

SUMMARY

Various embodiments are directed to a two-step single-slope comparator and a CMOS image sensor including the same that uses as a residue value a difference between a sampling value of a pixel signal and a sampling value of a first coarse step voltage and analog-to-digital-converts the residue value.

In an embodiment, a comparator may include a first comparison block suitable for sampling a pixel signal, comparing a voltage of a sampled pixel signal to a coarse ramping voltage, outputting a first comparison result signal, sampling a coarse step voltage and outputting a residue voltage, representing a difference between the voltage of the sampled pixel signal and the sampled coarse step voltage; and a second comparison block suitable for comparing a fine ramping voltage to the residue voltage outputted by the first comparison block and outputting a second comparison result signal.

In an embodiment, a complementary metal oxide semiconductor (CMOS) image sensor may include a pixel array suitable for outputting a pixel signal corresponding to an incident light; a row decoder suitable for selecting and controlling pixels of the pixel array row by row according to a control signal of a controller; a ramp signal generator suitable for generating a coarse ramping signal and a fine ramping signal according to the control signal of the controller; a first comparison block suitable for sampling the pixel signal outputted from the pixel array, comparing a sampled pixel signal to the coarse ramping signal outputted by the ramp signal generator, outputting a first comparison result signal, sampling a coarse step voltage and outputting a residue voltage, representing a difference between a voltage of the sampled pixel signal and the sampled coarse step voltage; and a second comparison block suitable for comparing the fine ramping voltage outputted from the ramp signal generator to the residue voltage outputted by the first comparison block and outputting a second comparison result signal; a counter suitable for counting a clock of the controller according to the first comparison result signal outputted by the first comparison block and the second comparison result signal outputted by the second comparison block; a memory suitable for storing counting information of the counter according to the control signal of the controller; a column read-out circuit suitable for outputting data stored in the memory according to the control signal of the controller; and the controller suitable for controlling operations of the row decoder, the ramp signal generator, the first comparison block, the second comparison block, the counter, the memory, and the column read-out circuit.

In an embodiment, a pixel array suitable for generating a pixel signal; a ramp signal generator suitable for generating coarse and fine ramping signals; a first comparison block suitable for generating a first comparison result signal by comparing the pixel signal to the coarse ramping signal; a second comparison block suitable for generating a second comparison result signal by comparing the fine ramping signal to a difference between the pixel signal and a coarse step signal; a counter suitable for counting a clock according to the first and second comparison result signals; and a column read-out circuit suitable for outputting a count result of the counter.

DETAILED DESCRIPTION

Various embodiments are described below with reference to the accompanying drawings. However, as will be apparent to those skilled in the art in light of the present disclosure, elements and features may be configured and arranged differently than shown in the disclosed embodiments. Thus, the disclosed embodiments are not to be construed as limiting. Moreover, in the description below, reference to "an embodiment" does not necessarily mean only one embodiment, and different references to "an embodiment" are not necessarily to the same embodiment(s).

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

As used herein, singular forms may include the plural forms as well, unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
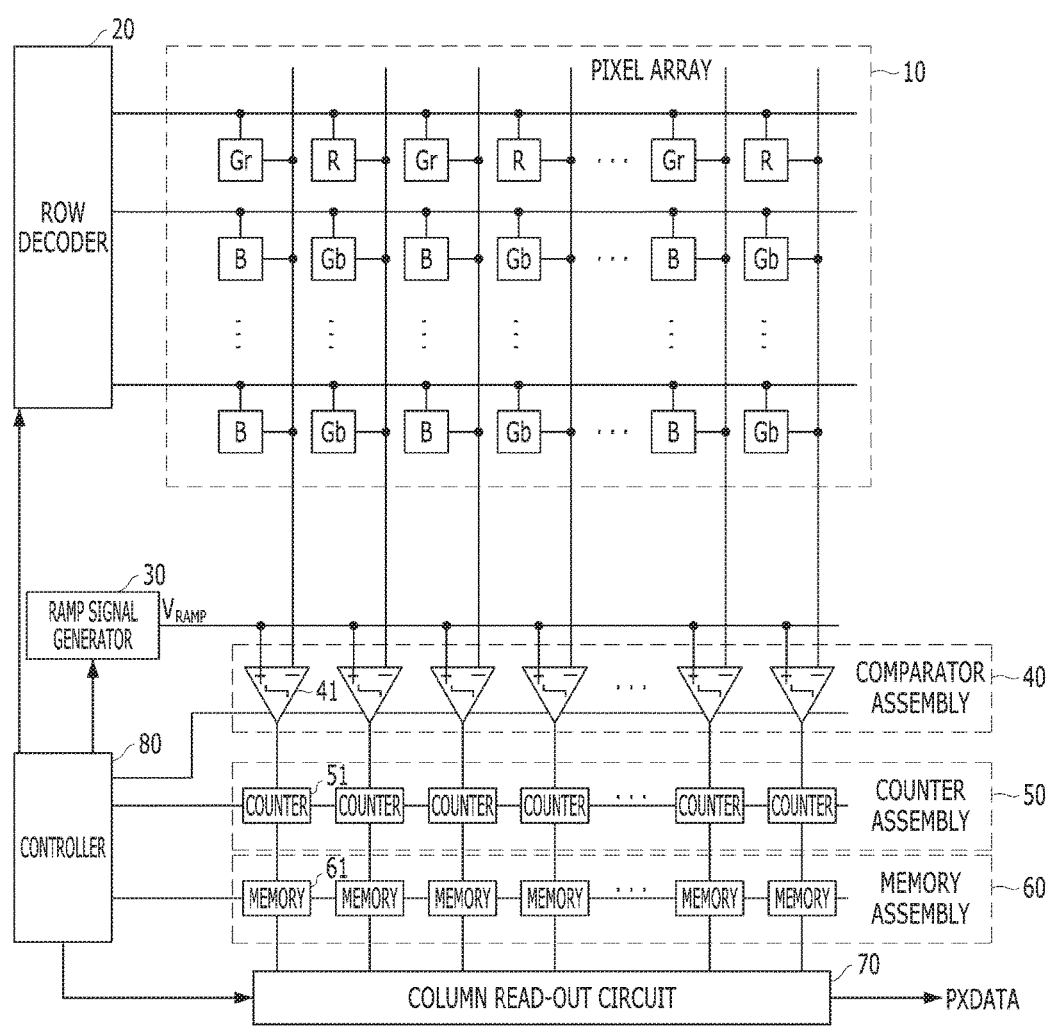
FIG. 1 is a diagram illustrating a typical CMOS image sensor in accordance with one or more embodiments of the present disclosure.

FIG. 1 is a diagram illustrating a typical CMOS image sensor in accordance with an embodiment of the present disclosure. The typical CMOS image sensor shown in FIG. 1 includes a column parallel structure using a single-slope analog-to-digital conversion device.

Referring to FIG. 1, the typical CMOS image sensor includes a pixel array 10, a row decoder 20, a ramp signal generator 30, a comparator assembly 40, a counter assembly 50, a memory assembly 60, a column read-out circuit 70, and a controller 80.

The pixel array 10 outputs a pixel signal corresponding to an incident light.

The row decoder 20 selects and controls pixels of the pixel array row by row.

The ramp signal generator 30 generates a ramp signal $V_{RAMP}$ (including a coarse ramping signal and a fine ramping signal) in response to a control signal of the controller.

The comparator assembly 40 compares the ramp signal $V_{RAMP}$ of the ramp signal generator 40 with each pixel signal outputted from the pixel array.

The counter assembly 50 counts a clock of the controller 80 according to an output signal of the comparator assembly 40.

The memory assembly 60 stores counting information of the counter assembly 50 according to the control of the controller 80.

The column read-out circuit 70 outputs sequentially the stored data of the memory assembly 60 as a pixel data PXDATA according to the control of the controller 80.

The controller 80 controls operations of the row decoder 20, the ramp signal generator 30, the comparator assembly 40, the counter assembly 50, the memory assembly 60, and the column read-out circuit 70.

In general, in a CMOS image sensor, a correlated double sampling (CDS) technique for removing an offset value of the pixel is performed in the comparator assembly 40.

The comparator assembly 40 includes a plurality of comparators 41, the counter assembly 50 includes a plurality of counters 51, and the memory assembly 60 includes a plurality of memories 61. That is, the comparator 41, the counter 51 and the memory 61 are included in each column.

The operations of the comparator 41, the counter 51 and the memory 61 will be described with reference to FIG. 1 below.

The comparator 41 receives a pixel signal outputted from a first column of the pixel array 10 through a first terminal and receives a ramp signal $V_{RAMP}$ outputted from the ramp signal generator 30. The comparator 41 compares the ramp signal $V_{RAMP}$ with the pixel signal and outputs a comparison result signal according to the control of the controller 80.

Since a voltage level of the ramp signal $V_{RAMP}$ increases or decreases in an elapsed time after an initialization, a value of the ramp signal $V_{RAMP}$ crosses a value of the pixel signal at a particular time. A value of the comparison result signal outputted from the comparator 41 is inverted after the value of the ramp signal $V_{RAMP}$ crosses the value of the pixel signal.

Thus, the counter 51 outputs the counting information by counting a clock of the controller 80 from a falling time of the ramp signal by the inversion time of the comparison result signal outputted from the comparator 41. The counter 51 is initialized by a reset control signal of the controller 80.

The memory 61 stores and outputs the counting information of the counter 51 to the column read-out circuit 70 according to the control signal of the controller 80.

The CMOS image sensor performs a counting operation on a reset signal (or a reset voltage) and then performs a counting operation on an image signal (a signal voltage).

Figure 2A:
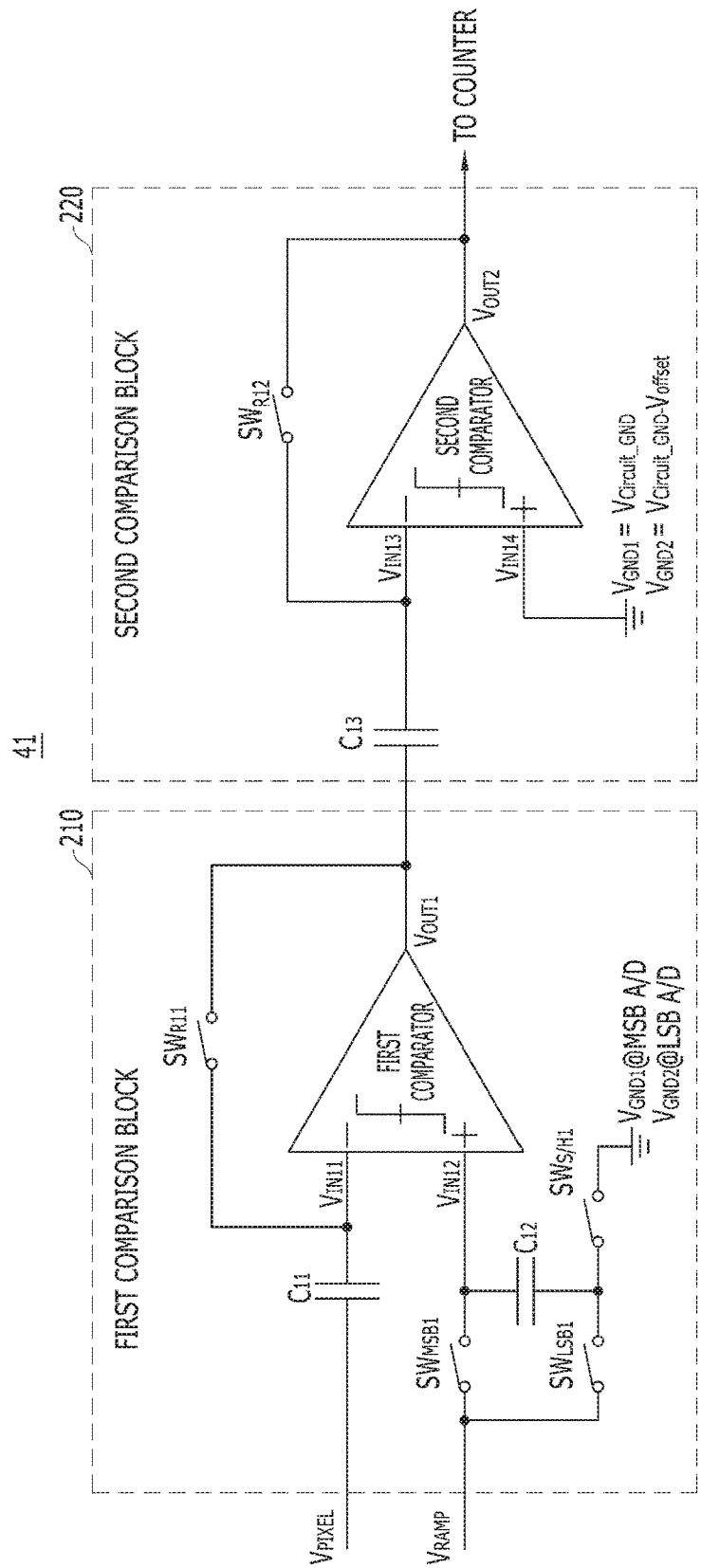
FIG. 2A is an exemplary circuit diagram illustrating a comparator shown in FIG. 1.

FIG. 2A is an exemplary circuit diagram illustrating a comparator 41 shown in FIG. 1.

Figure 2B:
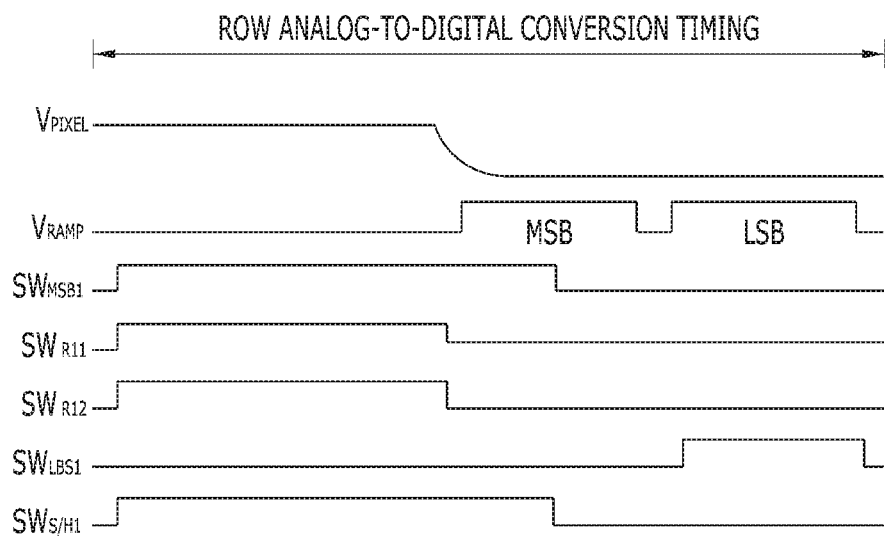
FIG. 2B is an exemplary timing diagram illustrating a row analog-to-digital conversion operation of the comparator shown in FIG. 2A.

FIG. 2B is a timing diagram illustrating a row analog-to-digital conversion operation of the comparator 41 shown in FIG. 2A.

Figure 2C:
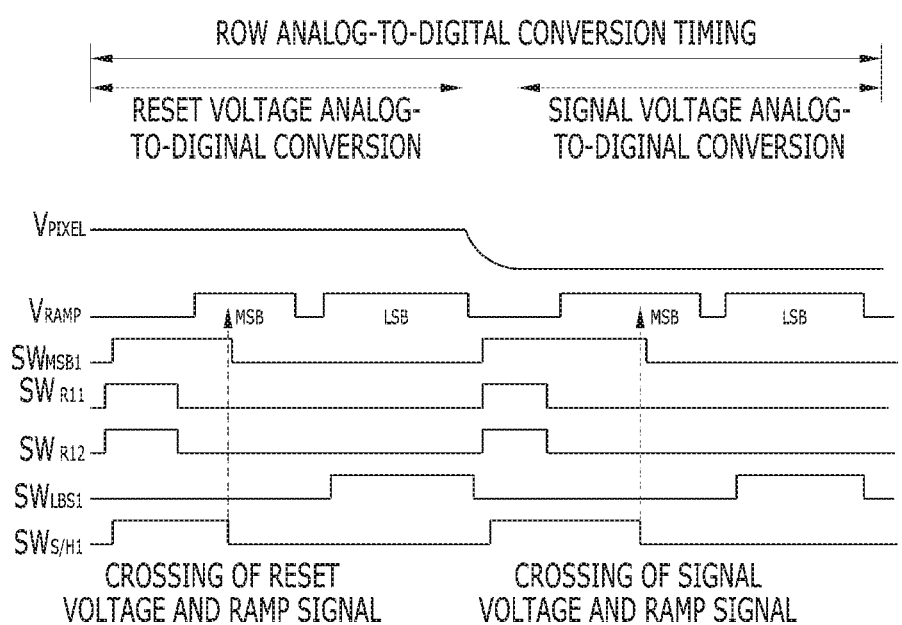
FIG. 2C is an exemplary digital double sampling (DDS) timing diagram illustrating a row analog-to-digital conversion operation of the comparator shown in FIG. 2A.

FIG. 2C is a digital double sampling (DDS) timing diagram illustrating a row analog-to-digital conversion operation of the comparator 41 shown in FIG. 2A.

Referring to FIG. 2A, the comparator 41 includes a first comparison block 210 and a second comparison block 220.

The first comparison block 210 samples a pixel signal $V_{PIXEL}$, compares a sampled pixel signal with a coarse ramping signal, and outputs a first comparison result signal. The first comparison block 210 samples a coarse step voltage $V_{MSB}$, changes a sampled coarse step voltage to a fine ramping voltage, compares the pixel signal with the fine ramping voltage, and outputs a second comparison result signal.

The second comparison block 220 amplifies the first comparison result signal and the second comparison result signal outputted from the first comparison block 210, and outputs amplified first and second comparison result signals to the counter 51.

Structurally, the first comparison block 210 includes a first capacitor $C_{11}$, a first switch $SW_{R11}$, a second switch $SW_{MSB1}$, a second capacitor $C_{12}$, a third switch $SW_{S/H1}$, a fourth switch $SW_{LSB1}$, and a first comparator FIRST COMPARATOR.

The first capacitor $C_{11}$ samples the pixel signal $V_{PIXEL}$ received through a first terminal thereof, and a second terminal of the first capacitor $C_{11}$ is coupled to a negative input node of the first comparator FIRST COMPARATOR.

The first switch $SW_{R11}$ is coupled to form a first feedback loop between the negative input node of the first comparator FIRST COMPARATOR and an output node of the first comparator FIRST COMPARATOR.

The second switch $SW_{MSB1}$ switches on or off a coarse ramping voltage received through a first terminal thereof, and a second terminal of the second switch $SW_{MSB1}$ is coupled to a positive input node of the first comparator FIRST COMPARATOR.

The second capacitor $C_{12}$ samples a coarse step voltage $V_{MSB}$, and a first terminal of the second capacitor $C_{12}$ is coupled to positive input node of the first comparator FIRST COMPARATOR.

The third switch $SW_{S/H1}$ is coupled between a second terminal of the second capacitor $C_{12}$ and a ground terminal, for example, having a first ground voltage $V_{GND1}$ for a MSB conversion or a second ground voltage $V_{GND2}$ for a LSB conversion.

The fourth switch $SW_{LSB1}$ switches on or off the fine ramping voltage received through a first terminal of the fourth switch $SW_{LSB1}$ and a second terminal of the fourth switch $SW_{LSB1}$ is coupled to the second terminal of the second capacitor $C_{12}$.

The first comparator FIRST COMPARATOR compares the pixel signal $V_{PIXEL}$ sampled at the first capacitor $C_{11}$ to the coarse ramping voltage, and outputs a first comparison result signal. The first comparator FIRST COMPARATOR compares the coarse step voltage $V_{MSB}$, which is sampled at the second capacitor $C_{12}$ and is changed according to the fine ramping voltage, to the pixel signal $V_{PIXEL}$, and outputs a second comparison result signal.

The second comparison block 220 includes third capacitor $C_{13}$, fifth switch $SW_{R12}$ and a second comparator SECOND COMPARATOR.

The third capacitor $C_{13}$ is coupled between the first comparison block 210 and a negative input node of the second comparator SECOND COMPARATOR and cuts off the transfer of a direct current (DC).

The fifth switch $SW_{R12}$ is coupled to form a second feedback loop between the negative input node of the second comparator SECOND COMPARATOR and an output node of the second comparator SECOND COMPARATOR.

A positive input node of the second comparator SECOND COMPARATOR is coupled to a ground terminal having a first ground voltage $V_{GND1}$ or a second ground voltage $V_{GND2}$. The first ground voltage $V_{GND1}$ is a circuit ground voltage $V_{Circuit\_GND}$ and the second ground voltage $V_{GND2}$ is a voltage $V_{Circuit\_GND} - V_{offset}$ acquired by subtracting an offset voltage $V_{offset}$ from the circuit ground voltage $V_{Circuit\_GND}$.

The second comparator SECOND COMPARATOR amplifies the first comparison result signal and the second comparison result signal of the first comparison block 210, and outputs the amplified first and second comparison result signals to the counter 51.

Each switch shown in FIG. 2A may be switched on or off according to the control signal of the controller 80.

Operation of the CDS technique will be described with reference to FIGS. 2A and 2B below.

If a reset voltage $V_{RST}$ of the pixel signal $V_{PIXEL}$ is applied, and the first switch $SW_{R11}$, the second switch $SW_{MSB1}$, the third switch $SW_{S/H1}$ and the fifth switch $SW_{R12}$ are switched on, the first feedback loop is formed on the first comparator FIRST COMPARATOR through the first switch $SW_{R11}$ and the second feedback loop is formed on the second comparator thorough the fifth switch $SW_{R12}$. Thus, the reset voltage $V_{RST}$ of the pixel signal $V_{PIXEL}$ is sampled at the first capacitor $C_{11}$, and the output voltage $V_{OUT1}$ of the first comparator FIRST COMPARATOR and the negative input voltage $V_{IN13}$ of the second comparator SECOND COMPARATOR become a common voltage through the third capacitor $C_{13}$.

Subsequently, if the first switch $SW_{R11}$ and the fifth switch $SW_{R12}$ are switched off, and the signal voltage $V_{SIG}$ of the pixel signal $V_{PIXEL}$ is applied, a signal voltage $V_{SIG}$-reset voltage $V_{RST}$ is inputted to the negative input node of the first comparator FIRST COMPARATOR through the first capacitor $C_{11}$, and a change value (i.e., difference between the signal voltage $V_{SIG}$ and the reset voltage $V_{RST}$) of the pixel signal $V_{PIXEL}$ is sampled.

If the coarse ramping voltage of the ramp signal $V_{RAMP}$ is applied to the positive input node of the first comparator FIRST COMPARATOR and is ramped with a coarse step, the first comparator FIRST COMPARATOR compares the negative input node voltage $V_{IN11}$ to the positive input node voltage $V_{IN12}$ and outputs a comparison result signal when the negative input node voltage $V_{IN11}$ becomes greater than the positive input node voltage $V_{IN12}$ (that is, from $V_{IN1} - V_{IN12} < 0$ to $V_{IN1} - V_{IN12} > 0$). Thus, the first comparator FIRST COMPARATOR accomplishes the MSB conversion, and the second switch $SW_{MSB1}$ and the third switch $SW_{S/H1}$ are switched off.

The coarse step voltage $V_{MSB}$ is sampled at the second capacitor $C_{12}$.

As described above, after the MSB conversion is completed through the coarse step, if the fourth switch $SW_{LSB1}$ is switched on, the fine ramping voltage of the ramp signal $V_{RAMP}$ is applied to the positive input node of the first comparator through the second capacitor $C_{12}$, and the ramping operation starts through the fine step and changes the coarse voltage. Thus, the LSB conversion is completed.

The positive input node voltage $V_{IN12}$ has a sum value of the coarse step voltage $V_{MSB}$ and the fine step voltage $V_{LSB}$ due to the charges sampled at the second capacitor $C_{12}$ during the MSB conversion operation.

An operation of a digital double sampling (DDS) operation will be described with reference to FIGS. 2A and 2C.

If the reset voltage $V_{RST}$ of the pixel signal $V_{PIXEL}$ is applied, and the first switch $SW_{R11}$, the second switch $SW_{MSB1}$, the third switch $SW_{S/H1}$ and the fifth switch $SW_{R12}$ are switched on, the first feedback loop is formed to the first comparator through the first switch $SW_{R11}$ and the second feedback loop is formed on the second comparator SECOND COMPARATOR thorough the fifth switch $SW_{R12}$. Thus, the reset voltage $V_{RST}$ of the pixel signal $V_{PIXEL}$ is sampled at the first capacitor $C_{11}$, the output voltage $V_{OUT1}$ of the first comparator FIRST COMPARATOR and the negative input voltage $V_{IN13}$ of the second comparator SECOND COMPARATOR become a common voltage through the third capacitor $C_{13}$.

Subsequently, if the first switch $SW_{R11}$ and the fifth switch $SW_{R12}$ are switched off, and the coarse ramping voltage of the ramp signal $V_{RAMP}$ is applied to the positive input node of the first comparator FIRST COMPARATOR and is ramped with the coarse step, the first comparator FIRST COMPARATOR compares the negative input node voltage $V_{IN11}$ to the positive input node voltage $V_{IN12}$ and outputs a comparison result signal when the negative input node voltage $V_{IN11}$ becomes greater than the positive input node voltage $V_{IN12}$ (that is, from $V_{IN1}-V_{IN12}<0$ to $V_{IN1}-V_{IN12}>0$). Thus, the first comparator FIRST COMPARATOR accomplishes the MSB conversion, a code value is stored, and the second switch $SW_{MSB1}$ and the third switch $SW_{S/H1}$ are switched off.

The coarse step voltage $V_{MSB}$ is sampled at the second capacitor $C_{12}$.

As described above, after the MSB conversion is completed through the coarse step, if the fourth switch $SW_{LSB1}$ is switched on, the fine ramping voltage of the ramp signal $V_{RAMP}$ is applied to the positive input node of the first comparator FIRST COMPARATOR through the second capacitor $C_{12}$, and the ramping operation starts through the fine step. Thus, the LSB conversion is completed and the code value is stored.

Subsequently, if the signal voltage $V_{SIG}$ of the pixel signal $V_{PIXEL}$ is applied, after a code value is stored by performing the above-described two-step operations (the coarse step and the fine step), the DDS operation may be implemented by subtracting the code value of the reset voltage $V_{RST}$ from the code value of the signal voltage $V_{SIG}$.

However, the comparator shown in FIG. 2A has a gain error due to a parasitic capacitor between the second capacitor $C_{12}$ and a gate and a source of the input transistor of the first comparator FIRST COMPARATOR when the fine ramp voltage of the ramp signal $V_{RAMP}$ is applied through the second capacitor $C_{12}$.

Thus, a voltage value of (coarse step voltage+fine step voltage)×gain error is applied to the positive input node of the first comparator FIRST COMPARATOR, and the non-linearity is increased.

Figure 3A:
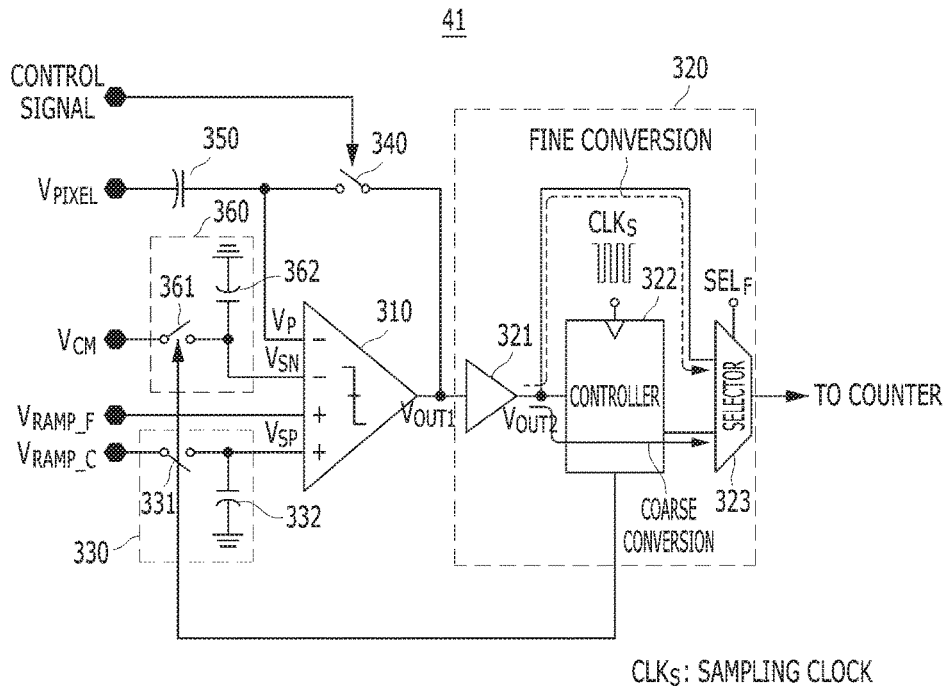
FIG. 3A is another exemplary circuit diagram illustrating a comparator shown in FIG. 1.

FIG. 3A is another exemplary circuit diagram illustrating a comparator 41 shown in FIG. 1.

Figure 3B:
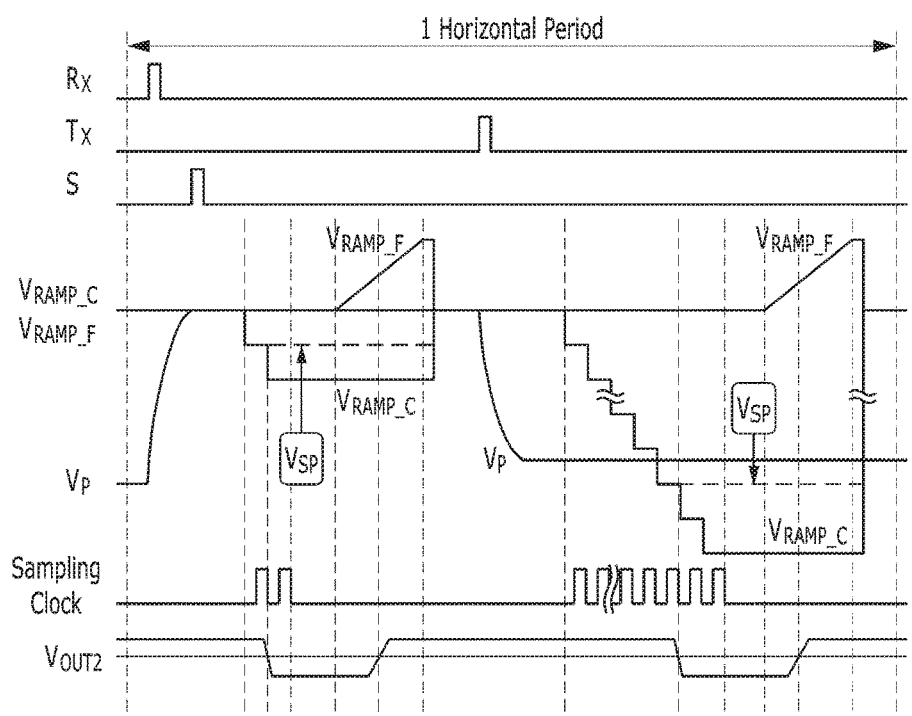
FIG. 3B is an exemplary timing diagram illustrating a horizontal period of the comparator shown in FIG. 3A.

FIG. 3B is a timing diagram illustrating a horizontal period of the comparator 41 shown in FIG. 3A.

Referring to FIG. 3A, the comparator 41 according to another embodiment of the present invention includes a pre-amplifier 310, a signal processor 320, a coarse ramping voltage sampling circuit 330, and a common mode voltage sampling circuit 360.

The common mode voltage sampling circuit 360 samples a common mode voltage $V_{CM}$ according to a sampling control signal of the signal processor 320.

The coarse ramping voltage sampling circuit 330 samples a coarse ramping voltage $V_{RAMP\_C}$ according to a sampling control signal of the signal processor 320.

The pre-amplifier 310 amplifies a difference between an input voltage $V_p$ and a sampled coarse ramping voltage $V_{SP}$ and outputs a coarse conversion result. The pre-amplifier 310 amplifies a difference between a fine ramping voltage $V_{RAMP\_F}$ and a sampled common mode voltage $V_{SN}$ of the common mode voltage sampling circuit 360 and outputs a fine conversion result.

The signal processor 320 generates the sampling control signal according to the coarse conversion result of the pre-amplifier 310, and outputs a comparison result signal to the counter 51 or a line memory 61 according to the coarse conversion result and the fine conversion result of the pre-amplifier 310.

More specifically, the common mode voltage sampling circuit 360 includes a first switch 361 and a first capacitor 362.

The first switch 361 cuts off the common mode voltage $V_{CM}$ according to the sampling control signal of the signal processor 320.

The first capacitor 362 stores the common mode voltage $V_{CM}$ at a cutting-off time of the first switch 361.

The coarse ramping voltage sampling circuit 330 includes a second switch 331 and a second capacitor 332.

The second switch 331 cuts off the coarse ramping voltage $V_{RAMP\_C}$ according to the sampling control signal of the signal processor 320.

The second capacitor 332 stores the coarse ramping voltage $V_{RAMP\_C}$ at a cutting-off time of the second switch 331.

The signal processor 320 includes an amplifier 321, a controller 322 and selector 323.

The amplifier 321 amplifies the coarse conversion result and the fine conversion result of the pre-amplifier 310.

The controller 322 generates the sampling control signal according to the coarse conversion result of the amplifier 321.

The selector 323 selects the coarse conversion result of the amplifier via the controller 322 or the fine conversion result of the amplifier 321 according to a selection signal $SEL_F$ received from a timing generator (not shown), for example. The selector 323 outputs the comparison result signal to the counter 51 or the line memory 61.

The coarse conversion result is synchronized with sampling clocks CLKs of the controller 322 and is transferred to the selector 323.

The amplifier 321 may be an additional element. That is, the signal processor 320 may be implemented without the amplifier 321. In this case, the coarse conversion result of the pre-amplifier 310 is transferred to the controller 322 and the fine conversion result of the pre-amplifier 310 is transferred to the selector 323.

The comparator 41 may further include a third switch 340 for resetting the pre-amplifier 310 according to the control signal. That third switch 340 resets the pre-amplifier 310 by switching on or off an output voltage of the pre-amplifier 310, which is feedback to an input terminal of the pre-amplifier 310, according to a control signal from another controller (not shown).

Also, the comparator 41 may further include a third capacitor 350 for decoupling the pixel voltage $V_{PIXEL}$ from the output voltage of the pre-amplifier 310, which is feedback.

Operation of the comparator shown in FIG. 3A will be described with reference to FIG. 3B.

At a first step, the input voltage $V_p$ of the pre-amplifier 310 is compared to the sampled coarse ramping voltage $V_{sp}$ of the coarse ramping voltage sampling circuit 330. The difference between the input voltage $V_p$ of the pre-amplifier 3210 and the sampled coarse ramping voltage $V_{sp}$ of the coarse ramping voltage sampling circuit 330 is amplified and transferred as an output voltage $V_{OUT1}$ of the pre-amplifier 310 to the signal processor 320 via the output terminal of the pre-amplifier 310.

The output voltage $V_{OUT1}$ of the pre-amplifier 310 enables the signal processor 320 to generate the sampling control signal. The second switch 331 is switched off in response to the sampling control signal, and the coarse ramping voltage $V_{RAMP\_C}$, which is passing through the second switch 331, is stored on the second capacitor 332. At the same time, the signal processor 320 transfers the comparison result signal to the counter 51 such that a coarse digital code is determined.

At a second step, the pre-amplifier 310 amplifies the difference between the fine ramping voltage $V_{RAMP\_F}$ of the pre-amplifier 310 and the sampled common mode voltage $V_{SN}$ of the common mode voltage sampling circuit 360, and outputs the fine conversion result. The output voltage $V_{OUT1}$ of the pre-amplifier 310 is transferred to the signal processor 320 via the output terminal of the pre-amplifier 310. Then, the signal processor 320 transfers the comparison result signal to the counter 51 such that a fine digital code is determined.

However, in the comparator shown in FIG. 3A, a linearity error caused by a transfer conductance of each input transistor occurs because the transfer conductance of the each input transistor is changed according to the common voltage level.

Thus, in embodiments of the present invention, in order to prevent the linearity error caused by a conventional two-step single-slope analog-to-digital conversion structure, an analog-to-digital-converting operation is performed on a residual value, which is a difference between a sampling value of a pixel signal and a sampling value of coarse step voltage.

Hereinafter, a comparator according to embodiments of the present invention will be described with reference to FIGS. 4A to 6.

Figure 4A:
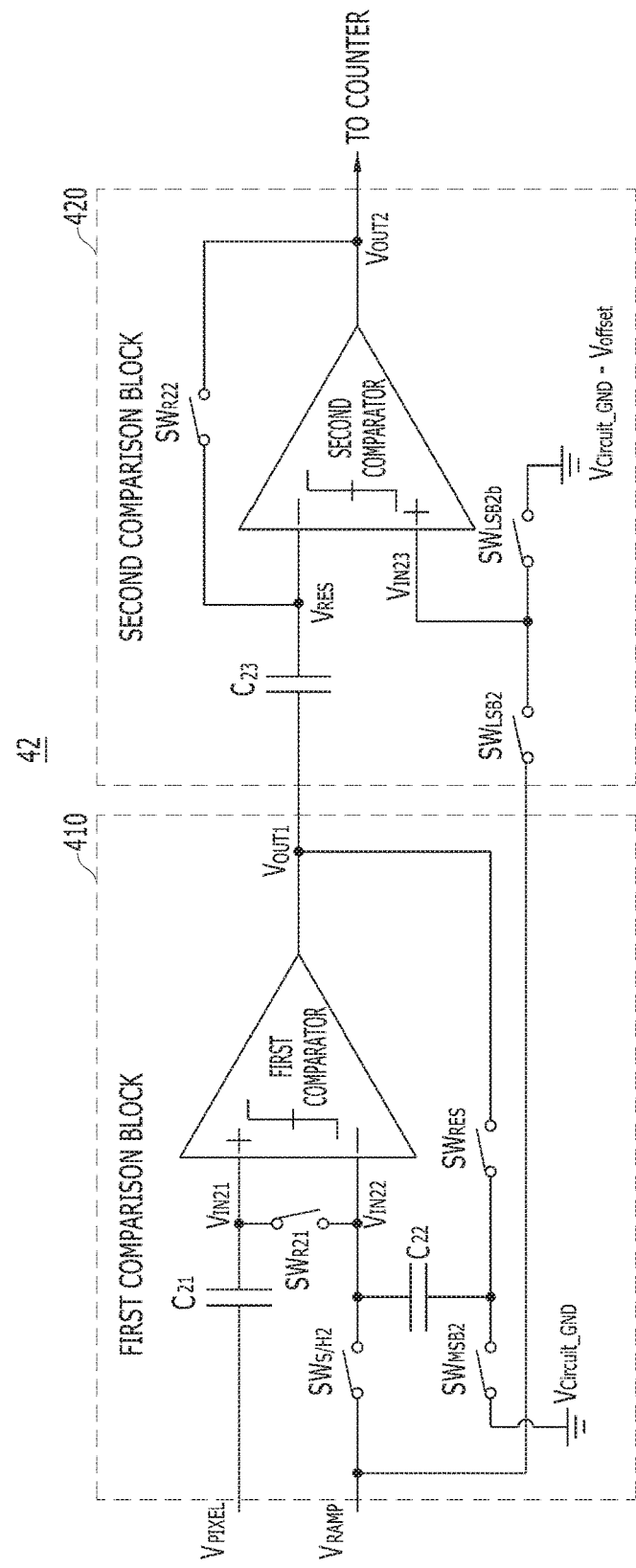
FIG. 4A is an exemplary circuit diagram illustrating a comparator in accordance with an embodiment of the present invention.

FIG. 4A is an exemplary circuit diagram illustrating a comparator 42 in accordance with an embodiment of the present invention.

Figure 4B:
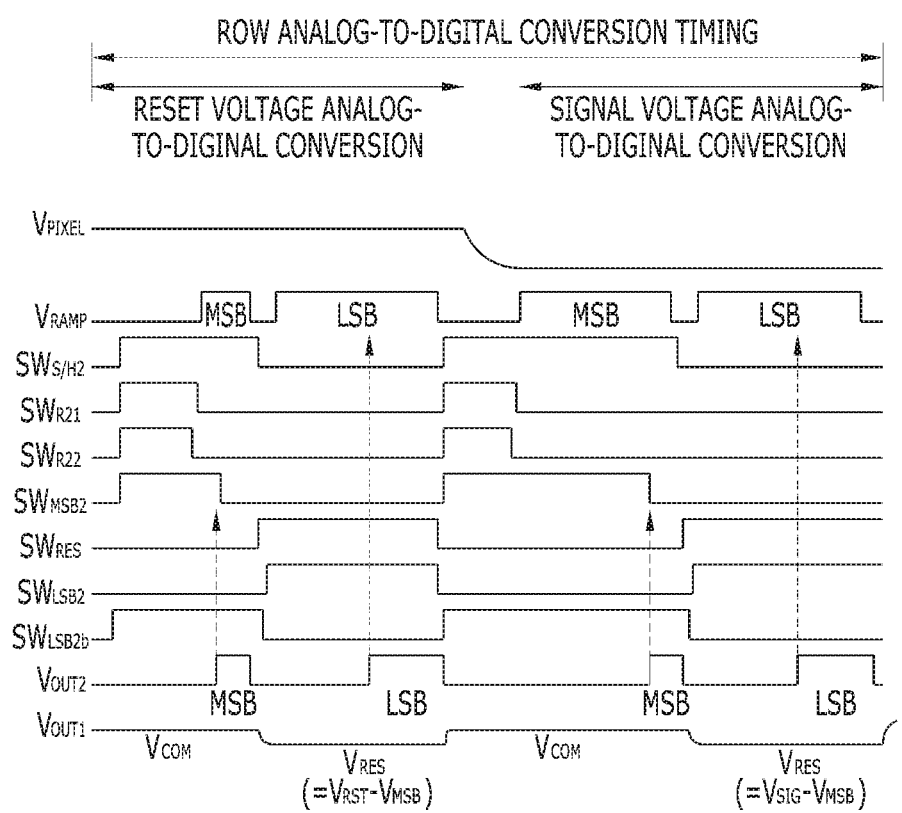
FIG. 4B is an exemplary digital double sampling (DDS) timing diagram illustrating a row analog-to-digital conversion operation of the comparator shown in FIG. 4A.

FIG. 4B is a digital double sampling (DDS) timing diagram illustrating a row analog-to-digital conversion operation of the comparator 42 shown in FIG. 4A.

Figure 4C:
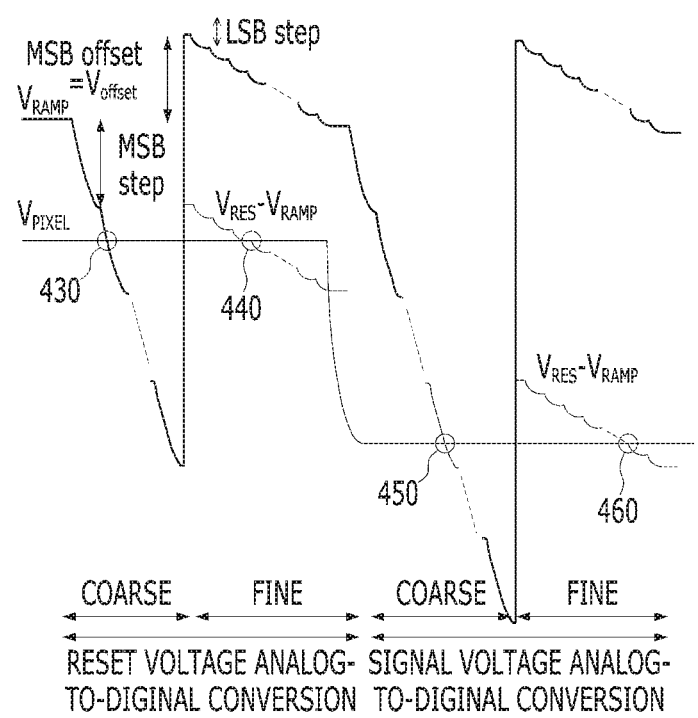
FIG. 4C is an exemplary diagram illustrating a crossing timing of the comparator shown in FIG. 4A.

FIG. 4C is a diagram illustrating a crossing timing of the comparator 42 shown in FIG. 4A.

Referring to FIG. 4A, a comparator 42 in accordance with an embodiment of the present invention includes a first comparison block 410 and a second comparison block 420.

The first comparison block 410 samples a pixel signal $V_{PIXEL}$, compares a sampled pixel signal $V_{PIXEL}$ with a coarse ramping voltage, and outputs a first comparison result signal. The first comparison block 410 samples a coarse step voltage $V_{MSB}$, and outputs a residue voltage $V_{RES}$, which represents a difference between the sampled pixel signal and the sampled coarse step voltage.

The second comparison block 420 compares a fine ramping voltage with the residue voltage $V_{RES}$ of the first comparison block 410, and outputs a second comparison result signal.

Structurally, the first comparison block 410 includes a first capacitor $C_{21}$, a first switch $SW_{R21}$, a second switch $SW_{S/H2}$, a second capacitor $C_{22}$, a third switch $SW_{MSB2}$, a fourth switch $SW_{RES}$ and a first comparator FIRST COMPARATOR.

The first capacitor $C_{21}$ samples a pixel signal $V_{PIXEL}$ received through a first terminal thereof, and a second terminal of the first capacitor $C_{21}$ is coupled to a positive input node of the first comparator FIRST COMPARATOR.

The first switch $SW_{R21}$ is coupled between the positive input node and a negative input node of the first comparator FIRST COMPARATOR.

The second switch $SW_{S/H2}$ switches on or off a coarse ramping voltage of the ramp signal $V_{RAMP}$ received through a first terminal thereof, and a second terminal of the second switch $SW_{S/H2}$ is coupled to the negative input node of the first comparator FIRST COMPARATOR.

The second capacitor $C_{22}$ samples a coarse step voltage $V_{MSB}$ and a first terminal of the second capacitor $C_{22}$ is coupled to the second terminal of the second switch $SW_{S/H2}$ and the negative input node of the first comparator FIRST COMPARATOR.

The third switch $SW_{MSB2}$ is coupled between the second terminal of the second capacitor $C_{22}$ and a ground terminal, for example, a circuit ground terminal $V_{Circuit\_GND}$.

The fourth switch $SW_{RES}$ is coupled to form the first feedback loop between the second terminal of the second capacitor $C_{22}$ and an output node of the first comparator FIRST COMPARATOR.

The first comparator FIRST COMPARATOR compares a sampled pixel signal of the first capacitor $C_{21}$ to the coarse ramping voltage applied through the second switch $SW_{S/H2}$, and outputs a first comparison result signal. The first comparator FIRST COMPARATOR outputs a residue voltage $V_{RES}$, which represents the difference between the sampled pixel signal of the first capacitor $C_{21}$ and the sampled coarse step voltage of the second capacitor $C_{22}$.

The second comparison block 420 includes a third capacitor $C_{23}$, a fifth switch $SW_{R22}$, a sixth switch $SW_{LSB2b}$, a seventh switch $SW_{LSB2}$ and a second comparator SECOND COMPARATOR.

The third capacitor $C_{23}$ transfers the residue voltage $V_{RES}$ outputted from the first comparison block 410 to a negative input node of the second comparator SECOND COMPARATOR.

The fifth switch $SW_{R22}$ is coupled to form a second feedback loop between the negative input node of the second comparator SECOND COMPARATOR and an output node of the second comparator SECOND COMPARATOR.

The sixth switch $SW_{LSB2b}$ is coupled between a positive input node of the second comparator SECOND COMPARATOR and a ground terminal, for example, having a voltage $V_{Circuit\_GND} - V_{offset}$ acquired by subtracting an offset voltage $V_{offset}$ from the circuit ground voltage $V_{Circuit\_GND}$.

The seventh switch $SW_{LSB2}$ switches on or off the fine ramping voltage received through a first terminal thereof, and a second terminal of the seventh switch $SW_{LSB2}$ is coupled to the positive input node of the second comparator SECOND COMPARATOR.

The second comparator SECOND COMPARATOR compares the residue voltage $V_{RES}$ transferred from the first comparison block 410 through the third capacitor $C_{23}$ to the fine ramping voltage applied through the seventh switch $SW_{LSB2}$, and outputs a second comparison result signal.

Each switch shown in FIG. 4A may be switched on or off according to a control signal of a controller (not shown), which may be, for example, a timing generator, or according to a feedback control signal of the comparator 42.

Next, operation of digital double sampling (DDS) will be described with reference to FIGS. 4B and 4C.

First, if the first switch $SW_{R21}$, the second switch $SW_{S/H2}$, the third switch $SW_{MSB2}$, the fifth switch $SW_{R22}$ and the sixth switch $SW_{LSB2b}$ are switched on, the coarse ramping voltage of the ramp signal $V_{RAMP}$ is applied through second switch $SW_{S/H2}$, the positive input node and the negative input node of the first comparator FIRST COMPARATOR are coupled through the first switch $SW_{R21}$, the second feedback loop is formed to the second comparator SECOND COMPARATOR through the fifth switch $SW_{R22}$, the second capacitor $C_{22}$ is coupled to the first ground terminal having a circuit ground voltage $V_{Circuit\_GND}$ through the third switch $SW_{MSB2}$, and the positive input node of the second comparator SECOND COMPARATOR is coupled to the second ground terminal, which has the voltage $V_{Circuit\_GND} - V_{offset}$ acquired by subtracting the offset voltage $V_{offset}$ from the circuit ground voltage $V_{Circuit\_GND}$. Thus, the voltage values of all nodes are initialized.

If a reset voltage $V_{RST}$ of the pixel signal $V_{PIXEL}$ is applied, the reset voltage $V_{RST}$ is sampled at the first capacitor $C_{21}$, and the sampled reset voltage is applied to the positive input node of the first comparator FIRST COMPARATOR with a positive input voltage $V_{IN21}$.

Subsequently, the first switch $SW_{R21}$ and the fifth switch $SW_{R22}$ are switched off, and the coarse ramping voltage of the ramp signal $V_{RAMP}$ is applied to the negative input node of the first comparator FIRST COMPARATOR with a negative input voltage $V_{IN22}$ and is ramped with the coarse step.

Thus, the first comparator FIRST COMPARATOR compares the positive input voltage $V_{IN21}$ to the negative input voltage $V_{IN22}$ and outputs a first comparison result signal when the reset voltage $V_{RST}$ is changed to be less than the coarse ramping voltage (that is, changed from reset voltage-coarse voltage >0 to reset voltage-coarse ramping voltage <0, as indicated by reference numeral 430 of FIG. 4C). The output voltage $V_{OUT1}$ of the first comparator FIRST COMPARATOR and the output voltage $V_{OUT2}$ of the second comparator SECOND COMPARATOR are latched, and the counted code value is stored as an MSB conversion code value on a register.

The third switch $SW_{MSB2}$ and the second switch $SW_{S/H2}$ are sequentially switched off, and the coarse step voltage $V_{MSB}$ is sampled at the second capacitor $C_{22}$.

Subsequently, the fourth switch $SW_{RES}$ is switched on, and the first feedback loop of the first comparator FIRST COMPARATOR is formed through the second capacitor $C_{22}$. The difference voltage of the reset voltage $V_{RST}$ and the coarse step voltage $V_{MSB}$ is outputted as a residue voltage through the output node of the first comparator FIRST COMPARATOR.

The residue voltage $V_{RES}$ is applied to the negative input node through the third capacitor $C_{23}$. If the sixth switch $SW_{LSB2b}$ is switched off and the seventh switch $SW_{LSB2}$ is switched on, the fine ramping voltage of the ramp signal $V_{RAMP}$ is applied to the positive input node of the second comparator SECOND COMPARATOR and is ramped with the fine step.

The second comparator SECOND COMPARATOR compares the positive input voltage $V_{IN23}$ to the negative input voltage $V_{RES}$ and outputs a second comparison result signal when the reset voltage $V_{RST}$ is changed to be less than the sum of the coarse ramping voltage and the fine ramping voltage (that is, changed from reset voltage-coarse voltage-fine ramping voltage >0 to reset voltage-coarse ramping voltage-fine ramping voltage <0, as indicated by reference numeral 440 of FIG. 4C). The output voltage $V_{OUT2}$ of the second comparator SECOND COMPARATOR is latched, and the counted code value is stored as an LSB conversion code value on a register.

Since a full swing range of the reset voltage $V_{RST}$ is smaller than a full swing range of a signal voltage $V_{SIG}$, the number of coarse steps of the reset signal $V_{RST}$ may be confined to be less than the number of coarse steps of the signal voltage $V_{SIG}$. Also, for example, the offset voltage $V_{offset}$ may be greater than or equal to one coarse step.

Subsequently, if the signal voltage $V_{SIG}$ of the pixel signal $V_{PIXEL}$ is applied, after the code value counted by each latching time (indicated by reference numerals 450 and 460 of FIG. 4C) is stored by performing the above-described two-step operations, the digital double sampling (DDS) may be implemented by subtracting the code value of the reset voltage $V_{RST}$ from the code value of the signal voltage $V_{SIG}$.

Figure 5:
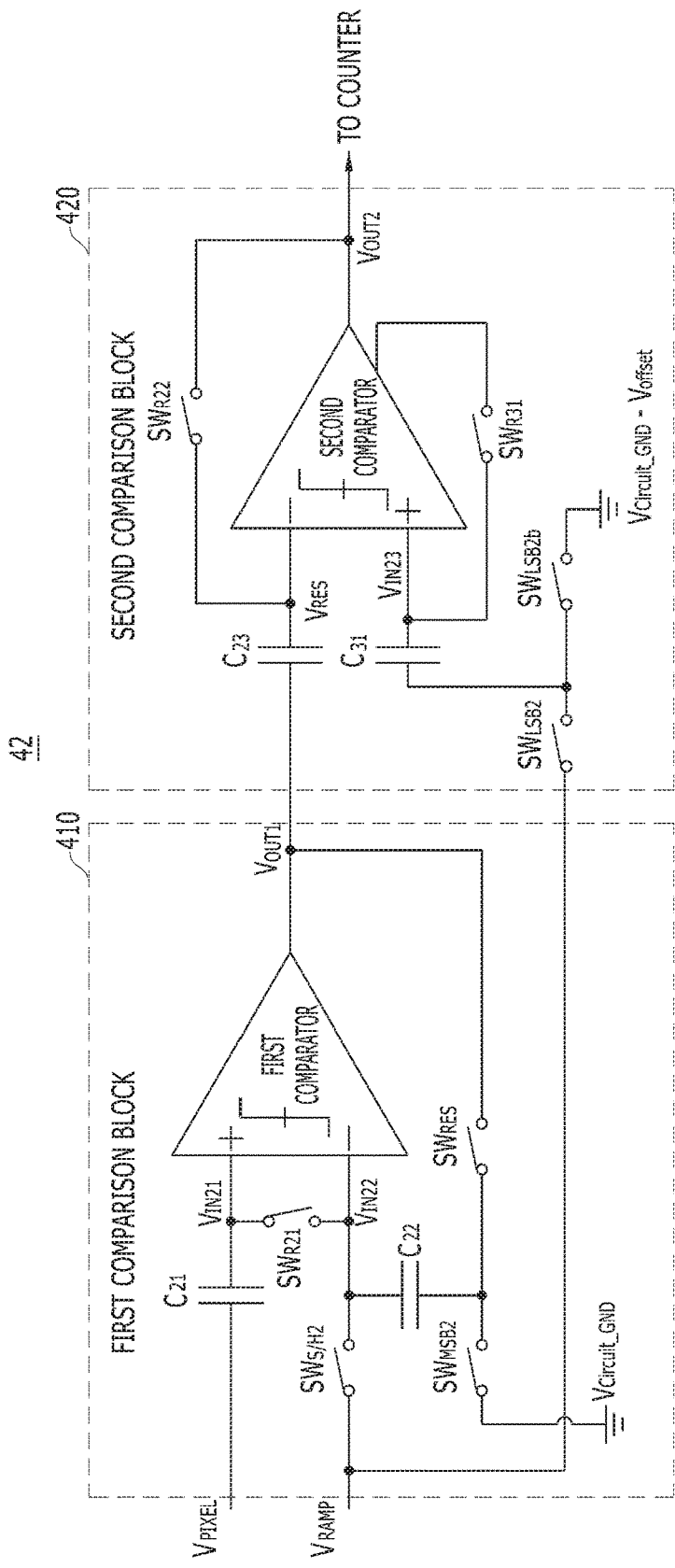
FIG. 5 is another exemplary circuit diagram illustrating a comparator in accordance with another embodiment of the present invention.

FIG. 5 is another exemplary circuit diagram illustrating the comparator 42 in accordance with another embodiment of the present invention.

In the comparator 42 shown in FIG. 4A, it is difficult to acquire an absolute voltage of a direct current (DC) bias voltage applied to the positive input node of the second comparator. Thus, the comparator 42 shown in FIG. 5 solves this problem.

Referring to FIG. 5, the comparator 42 in accordance with another embodiment of the present invention includes a first comparison block 410 and a second comparison block 420.

The first comparison block 410 includes a first capacitor $C_{21}$, a first switch $SW_{R21}$, a second switch $SW_{S/H2}$, a second capacitor $C_{22}$, a third switch $SW_{MSB2}$, a fourth switch $SW_{RES}$ and a first comparator FIRST COMPARATOR.

Since the configuration and operations of the first capacitor $C_{21}$, the first switch $SW_{R21}$, the second switch $SW_{S/H2}$, the second capacitor $C_{22}$, the third switch $SW_{MSB2}$, the fourth switch $SW_{RES}$ and the first comparator in the first comparison block 410 shown in FIG. 5 are the same as the configuration and operations of the first capacitor $C_{21}$, the first switch $SW_{R21}$, the second switch $SW_{S/H2}$, the second capacitor $C_{22}$, the third switch $SW_{MSB2}$, the fourth switch $SW_{RES}$ and the first comparator FIRST COMPARATOR in the first comparison block 410 shown in FIG. 4A, description of the first comparison block 410 in FIG. 5 will be omitted.

The second comparison block 420 includes a third capacitor $C_{23}$, a fourth capacitor $C_{31}$, a fifth switch $SW_{R22}$, a sixth switch $SW_{LSB2b}$, a seventh switch $SW_{LSB2}$, an eighth switch $SW_{R31}$ and a second comparator SECOND COMPARATOR.

Since the configuration and operations of the third capacitor $C_{23}$, the fifth switch $SW_{R22}$, the sixth switch $SW_{LSB2b}$, the seventh switch $SW_{LSB2}$ and a second comparator SECOND COMPARATOR in the second comparison block 420 shown in FIG. 5 are same as the configuration and operations of the third capacitor $C_{23}$, the fifth switch $SW_{R22}$, the sixth switch $SW_{LSB2b}$, the seventh switch $SW_{LSB2}$ and a second comparator SECOND COMPARATOR in the second comparison block 420 shown in FIG. 4A, the description of these components in the second comparison block 420 in FIG. 5 will be omitted.

The second comparison block 420 further comprises the fourth capacitor $C_{31}$ and the eighth switch $SW_{R31}$ as compared with the second comparison block 420 shown in FIG. 4A.

The fourth capacitor $C_{31}$ is coupled between the positive input node of the second comparator SECOND COMPARATOR and the second terminal of the seventh switch $SW_{LSB2}$ and transfers a changed value of the fine ramping voltage.

The eighth switch $SW_{R31}$ is coupled to form a third feedback loop between the output node of the second comparator and the positive input node of the second comparator SECOND COMPARATOR.

The absolute voltage of the DC bias voltage of the positive input node of the second comparator is provided as an input/output common voltage of the second comparator SECOND COMPARATOR by the eighth switch $SW_{R31}$. The changed value of the fine ramping voltage is applied to the positive input node of the second comparator through the fourth capacitor $C_{31}$.

Figure 6:
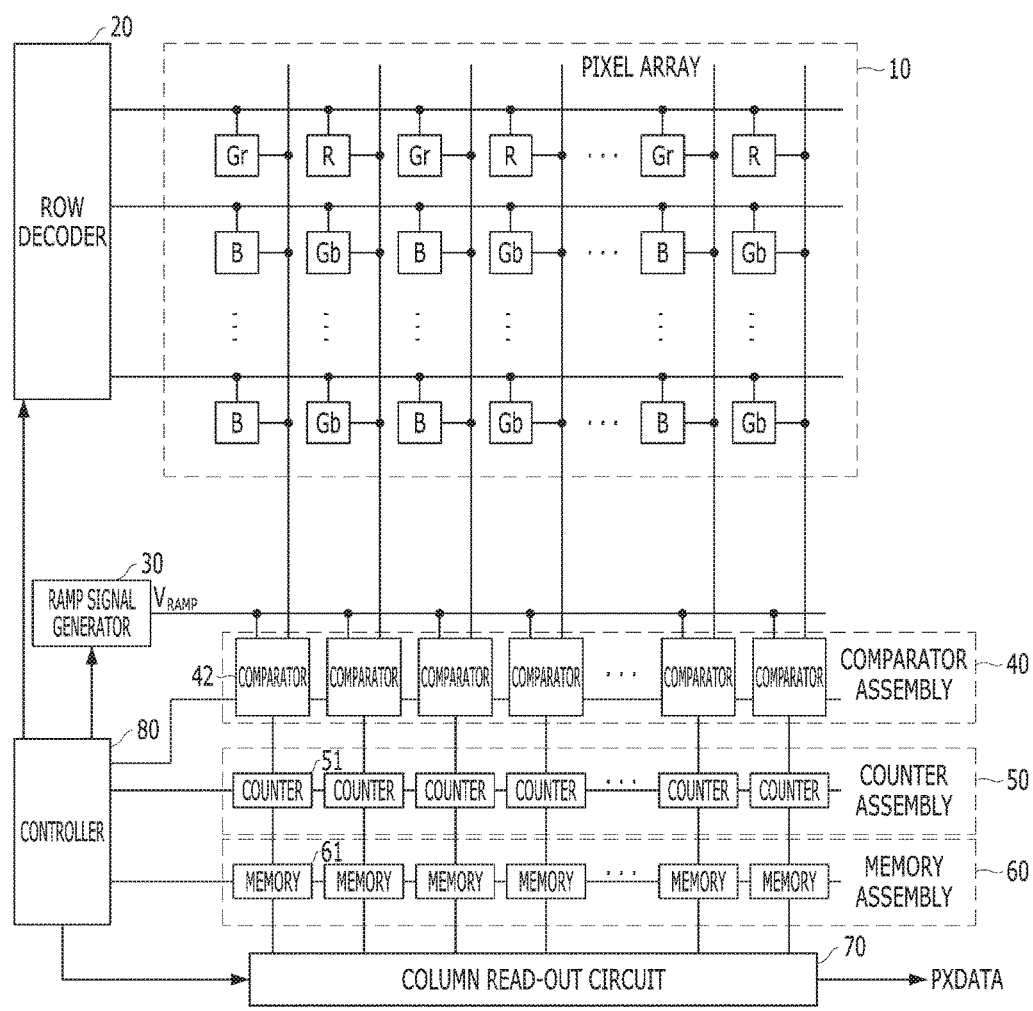
FIG. 6 is a diagram illustrating a CMOS image sensor including a comparator in accordance with one or more embodiments of the present invention.

FIG. 6 is a diagram illustrating a CMOS image sensor including the comparator 42 in accordance with embodiments of the present invention.

Referring to FIG. 6, the CMOS image sensor including a plurality of comparators 42 in accordance with embodiments of the present invention further includes a pixel array 10, a row decoder 20, a ramp signal generator 30, a comparator assembly 40, a counter assembly 50, a memory assembly 60, a column read-out circuit 70 and a controller 80.

The pixel array 10 outputs a pixel signal corresponding to an incident light.

The row decoder 20 selects and controls pixels of the pixel array row by row.

The ramp signal generator 30 generates a ramp signal $V_{RAMP}$, which includes the coarse ramping signal and the fine ramping signal, in response to a control signal of the controller.

The comparator assembly 40 compares the ramp signal $V_{RAMP}$ of the ramp signal generator 40 with each pixel signal outputted from the pixel array.

The counter assembly 50 counts a clock of the controller 80 according to an output signal of the comparator assembly 40.

The memory assembly 60 stores a counting information of the counter assembly 50 according to the control of the controller 80.

The column read-out circuit 70 outputs sequentially the stored data of the memory assembly 60 as a pixel data PXDATA according to the control of the controller 80.

The controller 80 controls operations of the row decoder 20, the ramp signal generator 30, the comparator assembly 40, the counter assembly 50, the memory assembly 60 and the column read-out circuit 70.

The comparator assembly 40 includes the comparator 42 shown in FIG. 4A or the comparator 42 shown in FIG. 5 in accordance with embodiments of the present invention.

Thus, in embodiments of the present invention, by performing an analog-to-digital converting operation on a residue value, which is a difference between a sampling value of a pixel signal and a sampling value of coarse step voltage, the linearity error caused by a conventional two-step single-slope analog-to-digital conversion structure is prevented.

Although various embodiments have been described and illustrated, it will be apparent to those skilled in the art that various changes and modifications may be made without departing from the spirit and scope of the disclosure as defined in the following claims.

What is claimed is:

1. A comparator, comprising:
 a first comparison block suitable for sampling a pixel signal, comparing a voltage of a sampled pixel signal to a coarse ramping voltage, outputting a first comparison result signal, sampling a coarse step voltage and outputting a residue voltage, representing a difference between the voltage of the sampled pixel signal and the sampled coarse step voltage; and
 a second comparison block suitable for comparing a fine ramping voltage to the residue voltage outputted by the first comparison block and outputting a second comparison result signal.

2. The comparator of claim 1, wherein the residue voltage is acquired by subtracting the sampled coarse step voltage from the voltage of the sampled pixel signal.

3. The comparator of claim 1, wherein the comparator is configured such that the number of coarse steps of a reset signal is less than the number of coarse steps of a signal voltage when the pixel signal is the reset signal.

4. The comparator of claim 1, wherein the first comparison block includes:
 a first capacitor suitable for sampling the pixel signal;
 a first switch coupled between two input nodes of a first comparator;
 a second switch suitable for switching on or off the coarse ramping voltage;
 a second capacitor suitable for being coupled to the second switch and sampling the coarse step voltage;
 a third switch coupled between the second capacitor and a ground terminal; and
 a fourth switch coupled to form a first feedback loop between the second capacitor and an output node of the first comparator; and
 the first comparator suitable for comparing the voltage of the sampled pixel signal sampled by the first capacitor to the coarse ramping voltage applied through the second switch, outputting the first comparison result signal, and outputting the residue voltage.

5. The comparator of claim 1, wherein the second comparison block includes:
 a third capacitor suitable for transferring the residue voltage outputted from the first comparison block to a second comparator;
 a fifth switch coupled to form a second feedback loop between a negative input node of the second comparator and an output node of the second comparator;
 a sixth switch coupled between a positive input node of the second comparator and a ground terminal;
 a seventh switch suitable for switching on or off the fine ramping voltage; and
 the second comparator suitable for comparing the residue voltage applied through the third capacitor to the fine ramping voltage applied through the seventh switch and outputting the second comparison result signal.

6. The comparator of claim 5, wherein the second comparison block further includes:
   an eighth switch coupled to form a third feedback loop between the positive input node of the second comparator and the output node of the second comparator; and
   a fourth capacitor coupled between the seventh switch and the positive input node of the second comparator and suitable for transferring a changed value of the fine ramping voltage to the second comparator.

7. A complementary metal oxide semiconductor (CMOS) image sensor, comprising:
   a pixel array suitable for outputting a pixel signal corresponding to an incident light;
   a row decoder suitable for selecting and controlling pixels of the pixel array row by row according to a control signal of a controller;
   a ramp signal generator suitable for generating a coarse ramping signal and a fine ramping signal according to the control signal of the controller;
   a first comparison block suitable for sampling the pixel signal outputted from the pixel array, comparing a sampled pixel signal to the coarse ramping signal outputted by the ramp signal generator, outputting a first comparison result signal, sampling a coarse step voltage and outputting a residue voltage, representing a difference between a voltage of the sampled pixel signal and the sampled coarse step voltage; and
   a second comparison block suitable for comparing the fine ramping voltage outputted from the ramp signal generator to the residue voltage outputted by the first comparison block and outputting a second comparison result signal;
   a counter suitable for counting a clock of the controller according to the first comparison result signal outputted by the first comparison block and the second comparison result signal outputted by the second comparison block;
   a memory suitable for storing counting information of the counter according to the control signal of the controller;
   a column read-out circuit suitable for outputting data stored in the memory according to the control signal of the controller; and
   the controller suitable for controlling operations of the row decoder, the ramp signal generator, the first comparison block, the second comparison block, the counter, the memory, and the column read-out circuit.

8. The CMOS image sensor of claim 7, wherein the residue voltage is acquired by subtracting the sampled coarse step voltage from the voltage of the sampled pixel signal.

9. The CMOS image sensor of claim 7, wherein the comparator is configured such that the number of coarse steps of a reset signal is less than the number of coarse steps of a signal voltage when the pixel signal is the reset signal.

10. The CMOS image sensor of claim 7, wherein the first comparison block includes:
   a first capacitor suitable for sampling the pixel signal;
   a first switch coupled between two input nodes of a first comparator;
   a second switch suitable for switching on or off the coarse ramping voltage;
   a second capacitor suitable for being coupled to the second switch and sampling the coarse step voltage;
   a third switch coupled between the second capacitor and a ground terminal;
   a fourth switch coupled to form a first feedback loop between the second capacitor and an output node of the first comparator; and
   the first comparator suitable for comparing the sampled pixel signal of the first capacitor to the coarse ramping voltage applied through the second switch, outputting the first comparison result signal, and outputting the residue voltage.

11. The CMOS image sensor of claim 7, wherein the second comparison block includes:
   a third capacitor suitable for transferring the residue voltage outputted from the first comparison block to a second comparator;
   a fifth switch coupled to form a second feedback loop between a negative input node of the second comparator and an output node of the second comparator;
   a sixth switch coupled between a positive input node of the second comparator and a ground terminal;
   a seventh switch suitable for switching on or off the fine ramping voltage; and
   the second comparator suitable for comparing the residue voltage applied through the first capacitor to the fine ramping voltage applied through the third switch and outputting the second comparison result signal.

12. The CMOS image sensor of claim 11, wherein the second comparison block further includes:
   an eighth switch coupled to form a third feedback loop between the positive input node of the second comparator and the output node of the second comparator; and
   a fourth capacitor coupled between the seventh switch and the positive input node of the second comparator and suitable for transferring a changed value of the fine ramping voltage to the second comparator.

13. A complementary metal oxide semiconductor (CMOS) image sensor comprising:
   a pixel array suitable for generating a pixel signal;
   a ramp signal generator suitable for generating coarse and fine ramping signals;
   a first comparison block suitable for generating a first comparison result signal by comparing the pixel signal to the coarse ramping signal;
   a second comparison block suitable for generating a second comparison result signal by comparing the fine ramping signal to a difference between the pixel signal and a coarse step signal;
   a counter suitable for counting a clock according to the first and second comparison result signals; and
   a column read-out circuit suitable for outputting a count result of the counter.

* * * * *